United States Patent
Chi et al.

(10) Patent No.: US 9,647,652 B2
(45) Date of Patent: May 9, 2017

(54) SEMICONDUCTOR DEVICE

(71) Applicant: SK hynix Inc., Gyeonggi-do (KR)

(72) Inventors: Sung-Soo Chi, Gyeonggi-do (KR); Young-Sik Heo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/000,154

(22) Filed: Jan. 19, 2016

(65) Prior Publication Data

US 2017/0033778 A1 Feb. 2, 2017

(30) Foreign Application Priority Data

Jul. 28, 2015 (KR) .......................... 10-2015-0106393

(51) Int. Cl.
| | |
|---|---|
| H03K 3/037 | (2006.01) |
| G11C 11/4076 | (2006.01) |
| H03K 5/14 | (2014.01) |
| G11C 11/4093 | (2006.01) |
| G11C 11/4094 | (2006.01) |
| H03K 5/00 | (2006.01) |

(52) U.S. Cl.
CPC ............ *H03K 5/14* (2013.01); *G11C 11/4076* (2013.01); *G11C 11/4093* (2013.01); *G11C 11/4094* (2013.01); *H03K 3/037* (2013.01); *H03K 2005/00019* (2013.01)

(58) Field of Classification Search
USPC ............................... 327/276–178; 324/762.01
See application file for complete search history.

(56) References Cited

U.S. PATENT DOCUMENTS

| | | | | |
|---|---|---|---|---|
| 6,815,970 | B2 * | 11/2004 | Rost ..................... | G01R 31/287 324/762.02 |
| 8,310,297 | B2 * | 11/2012 | Shimogawa ......... | H03K 3/0375 327/530 |
| 8,466,707 | B2 * | 6/2013 | Mohammad ........... | G11C 29/12 324/762.01 |
| 2014/0013131 | A1 | 1/2014 | Bansal et al. | |
| 2014/0320169 | A1 | 10/2014 | Chern et al. | |

* cited by examiner

*Primary Examiner* — An Luu

(74) *Attorney, Agent, or Firm* — IP & T Group LLP

(57) ABSTRACT

A semiconductor device includes a first pre-stress block suitable for generating a first load signal, which corresponds to an active signal during an active mode and/or to a high voltage level during a precharge mode, in response to a stress section signal; a first delay amount reflection block suitable for reflecting a first delay amount in the first load signal in response to one or more first delay amount control signals; and a first main stress block suitable for generating a word line driving control signal, which corresponds to the active signal during the active mode and the high voltage level during the precharge mode, in response to the stress section signal and the first load signal.

20 Claims, 6 Drawing Sheets

SEMICONDUCTOR DEVICE

CROSS-REFERENCE TO RELATED APPLICATIONS

The present application claims priority from Korean Patent Application No. 10-2015-0106393, filed on Jul. 28, 2015, which is incorporated herein by reference in its entirety.

BACKGROUND

1. Field

Various embodiments of the present invention relate to a semiconductor design technology, and more particularly to a semiconductor device.

2. Description of the Related Art

Continuous operation of semiconductor devices may result in performance and reliability degradation due to stress. Particularly, PMOS transistors comprised in a semiconductor device may deteriorate due to a phenomenon known as Negative Bias Temperature Instability (NBTI), and therefore, performance of the semiconductor device may also deteriorate.

According to the NBTI phenomenon, the threshold voltage of a PMOS transistor may increase due to stress and the PMOS transistor may be disturbed to form channels while the PMOS transistor is continuously turned on. As a result, one or more timing relations set inside a semiconductor device may change, and consequently, performance and reliability of the semiconductor device may deteriorate.

SUMMARY

Various embodiments of the present invention are directed to a more robust semiconductor device that is able to withstand NBTI. Performance and reliability of the semiconductor device remains substantially unaffected over an extended period of time of operation.

According to an embodiment of the present invention, a semiconductor device may include a first pre-stress block suitable for generating a first load signal, which corresponds to an active signal during an active mode and/or to a high voltage level during a precharge mode, in response to a stress section signal; a first delay amount reflection block suitable for reflecting a first delay amount in the first load signal in response to one or more first delay amount control signals; and a first main stress block suitable for generating a word line driving control signal, which corresponds to the active signal during the active mode and the high voltage level during the precharge mode, in response to the stress section signal and the first load signal.

The semiconductor device may further include a second pre-stress block suitable for generating a second load signal, which corresponds to the word line driving control signal during the active mode and the high voltage level during the precharge mode, in response to the stress section signal; a second delay amount reflection block suitable for reflecting a second delay amount in the second load signal in response to a plurality of second delay amount control signals; and a second main stress block suitable for generating a bit line equalization control signal, which corresponds to the word line driving control signal during the active mode and the high voltage level during the precharge mode, in response to the stress section signal and the second load signal.

The first main stress block and the second main stress block may be protected from stress caused by negative bias temperature instability (NBTI) during the precharge mode.

The semiconductor device may further include a stress section defining block suitable for generating the stress section signal corresponding to a stress section in response to the active signal and the bit line equalization control signal.

The stress section defining block may define the stress section ranging from a low-enablement of the bit line equalization control signal to a high-enablement of the active signal.

The stress section defining block may include an input unit suitable for receiving the active signal and the bit line equalization control signal; a first pulse generation unit suitable for generating a first pulse signal that pulses at the high-enablement of the active signal; a second pulse generation unit suitable for generating a second pulse signal that pulses at the low-enablement of the bit line equalization control signal; a section signal generation unit suitable for generating a section signal that is enabled during the stress section in response to the first pulse signal and the second pulse signal; and an output unit suitable for outputting the section signal as the stress section signal.

The section signal generation unit may include a RS latch circuit that enables the section signal in response to the second pulse signal and disables the section signal in response to the first pulse signal.

The semiconductor device may further include a stress prevention block suitable for disabling the first delay amount control signals and the second delay amount control signals during the stress section in response to the stress section signal.

The stress prevention block may generate the first delay amount control signals corresponding to a plurality of first delay amount set signals or the high voltage level, and generates the second delay amount control signals corresponding to a plurality of second delay amount set signals or the high voltage level in response to the stress section signal.

The first delay amount reflection block may include a plurality of first delay elements suitable for reflecting the first delay amount in the first load signal; and a plurality of first coupling units suitable for coupling the first delay elements to a first delay line where the first load signal is transmitted in response to the first delay amount control signals.

The second delay amount reflection block may Include a plurality of second delay elements suitable for reflecting the second delay amount in the second load signal; and a plurality of second coupling units suitable for coupling the second delay elements to a second delay line where the second load signal is transmitted in response to the second delay amount control signals.

The first coupling units and the second coupling units may be protected from stress caused by NBTI during the stress section.

According to another embodiment of the present invention, a semiconductor device may include a delay block suitable for generating an output signal in response to a plurality of delay amount control signals by delaying an input signal by a preset delay amount; a stress section defining block suitable for generating a stress section signal corresponding to a stress section in response to an operation-on signal and an operation-off signal corresponding to an operation mode and a wait mode of the delay block; and a stress prevention block suitable for disabling the delay amount control signals during the stress section in response to the stress section signal.

The delay block may include an input unit suitable for receiving the input signal; an output unit suitable for outputting the output signal; a delay line coupled between the input unit and the output unit; a plurality of delay elements suitable for reflecting the delay amount in the delay line; and a plurality of coupling elements suitable for coupling the delay elements to the delay line in response to the delay amount control signals.

The coupling elements may be protected from stress caused by negative bias temperature instability (NBTI) during the stress section.

The delay block may include a skewed delay circuit.

The stress section defining block may define the stress section ranging from enablement of the operation-off signal to enablement of the operation-on signal.

The stress section defining block may include an input unit suitable for receiving the operation-on signal and the operation-off signal; a first pulse generation unit suitable for generating a first pulse signal that pulses at the enablement of the operation-on signal; a second pulse generation unit suitable for generating a second pulse signal that pulses at the enablement of the operation-off signal; a section signal generation unit suitable for generating a section signal that is enabled during the stress section in response to the first pulse signal and the second pulse signal; and an output unit suitable for outputting the section signal as the stress section signal.

The section signal generation unit may include a RS latch circuit that enables the section signal in response to the second pulse signal and disables the section signal in response to the first pulse signal.

The stress prevention block may generate the delay amount control signals corresponding to a plurality of delay amount set signals or a high voltage level in response to the stress section signal.

DETAILED DESCRIPTION

Various embodiments of the present invention are described below with reference to the accompanying drawings. These embodiments are provided so that this disclosure is thorough and complete and are not intended to limit the scope of the invention.

The terminology used herein is for the purpose of describing particular embodiments of the invention only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, indicate the presence of stated features, but do not preclude the presence or addition of one or more other features. As used herein, the term "and/or" indicates any and all combinations of one or more of the associated listed items. It is also noted that in this specification, "connected/coupled" refers to one component not only directly coupling another component but also indirectly coupling another component through an intermediate component.

A memory device such as a DRAM device is described below as an example of a semiconductor device according to the present invention. However, it should be understood that the invention is not limited to a DRAM device and may be implemented with any other suitable semiconductor device.

Figure 1:
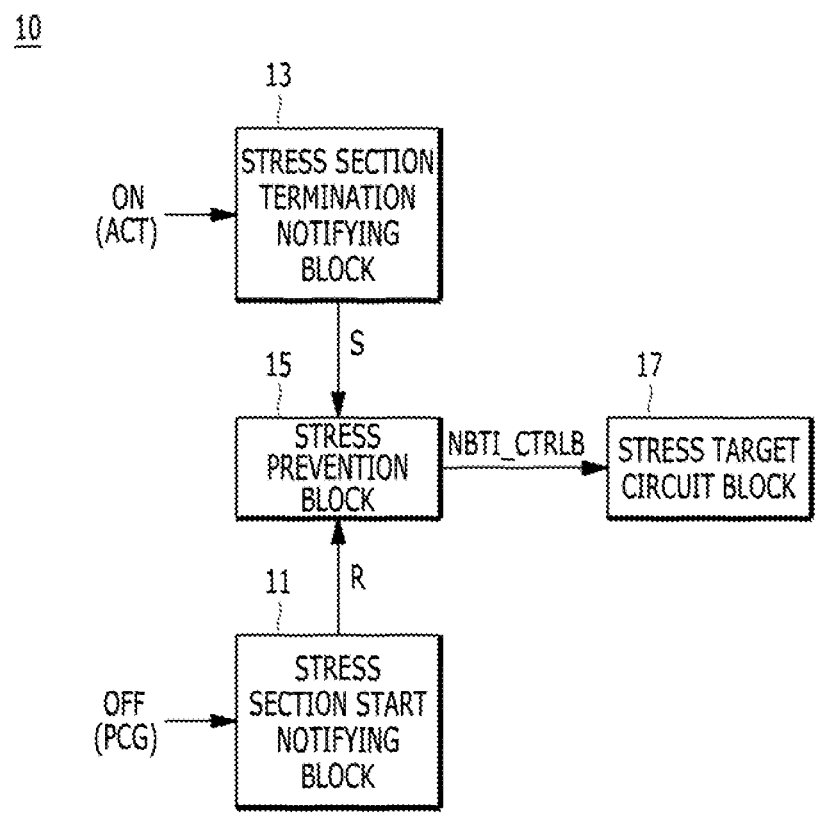
FIG. 1 is a block diagram illustrating a semiconductor device, according to an embodiment of the present invention.

Referring to FIG. 1, a memory device generally designated with numeral 10 may include a stress section start notifying block 11, a stress section termination notifying block 13, a stress prevention block 15, and a stress target circuit block 17.

The stress section start notifying block 11 may generate a start signal R that pulses corresponding to an enabling moment of an operation-off signal OFF. The operation-off signal OFF may be enabled during a precharge mode for precharging and equalizing a pair of bit lines.

The stress section termination notifying block 13 may generate a termination signal S that pulses corresponding to an enabling moment of an operation-on signal ON. The operation-on signal ON may be enabled during an active mode where a write operation or a read operation is performed.

The stress prevention block 15 may generate a stress section signal NBTI_CTRLB that is enabled in response to the start signal R and disabled in response to the termination signal S. The stress section signal NBTI_CTRLB may be enabled during a stress section corresponding to the precharge mode.

The stress target circuit block 17 may include a PMOS transistor that is vulnerable to the Negative Bias Temperature Instability (NBTI), and protect the PMOS transistor from stress caused by the NBTI during the stress section in response to the stress section signal NBTI_CTRLB. The stress target circuit block 17 may perform a predetermined operation during the active mode. Upon completion of the predetermined operation, the stress target circuit block 17 may enter a wait state during the precharge mode. During the walt state, the stress target circuit block 17 may turn off the PMOS transistor which is exposed to the NBTI. For example, the stress target circuit block 17 may drive a gate terminal of the PMOS transistor to a high voltage VDD level in response to the stress section signal NBTI_CTRLB during the stress section signal. Therefore, as the PMOS transistor is turned off during the stress section, the PMOS transistor may be protected from the stress caused by the NBTI.

Figure 2:
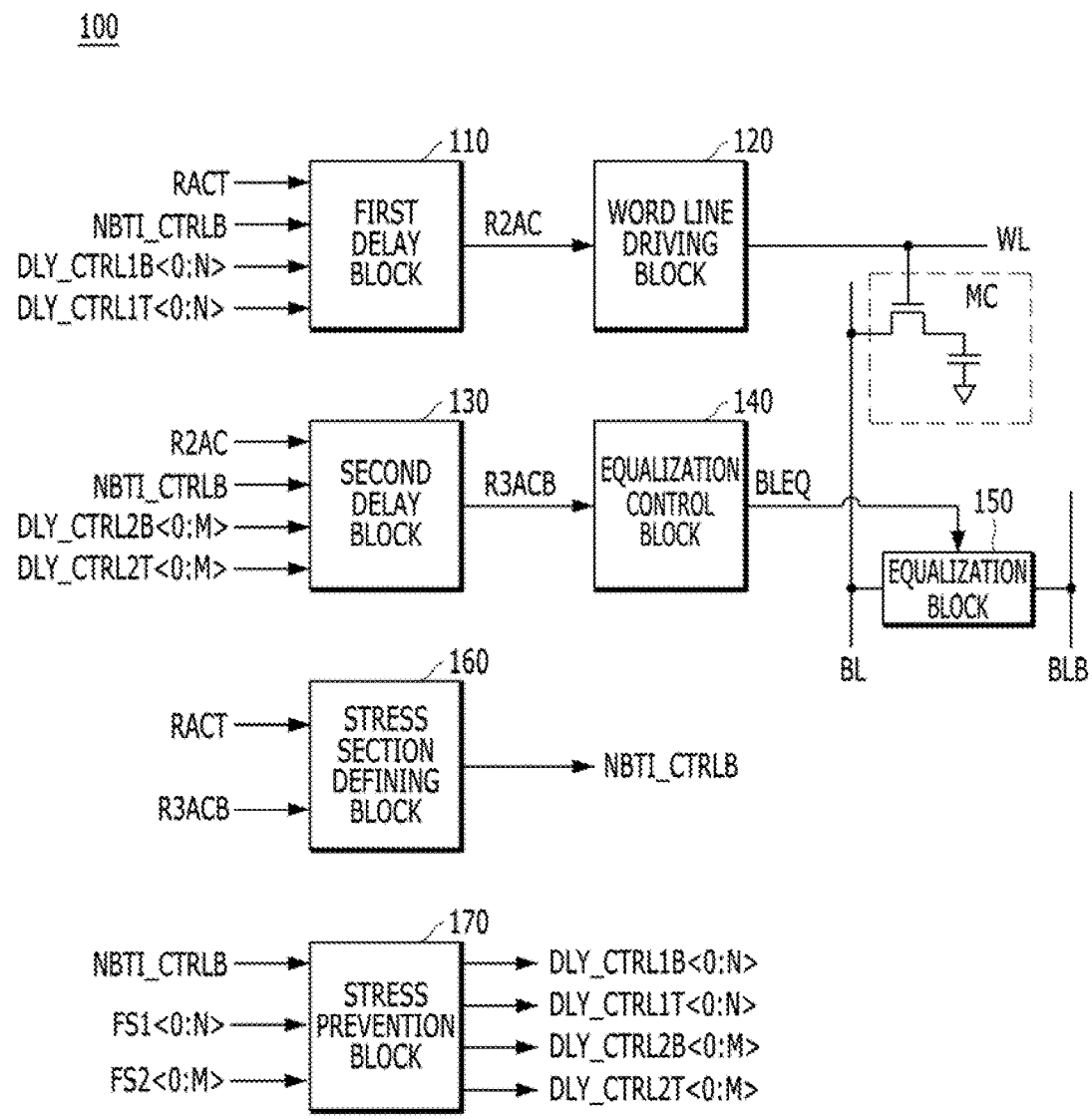
FIG. 2 is a block diagram illustrating a semiconductor device, according to an embodiment of the present invention.

FIG. 2 is a block diagram illustrating a memory device according to an embodiment of the present invention.

Referring to FIG. 2, a memory device 100 may include a first delay block 110, a word line driving block 120, a second delay block 130, an equalization control block 140, an equalization block 150, a stress section defining block 160, and a stress prevention block 170.

The first delay block 110 may generate a word line driving control signal R2AC in response to the active signal RACT, a stress section signal NBTI_CTRLB and a plurality of first delay amount control signals DLY_CTRL1T<0:N> and DLY_CTRL1B<0:N> by delaying an active signal RACT by a preset first delay amount stress section signal. For example, the first delay block 110 may include a skewed delay circuit for delaying a disablement edge of the active signal RACT.

The word line driving block 120 may drive a word line WL with a first voltage in response to the word line driving control signal R2AC. For example, the word line driving block 120 may drive the word line WL with a boosting voltage VPP during an active mode. Accordingly, a write operation or a read operation may be performed during the active mode.

The second delay block 130 may generate a bit line equalization control signal R3ACB in response to the word line driving control signal R2AC, the stress section signal NBTI_CTRLB and a plurality of second delay amount control signals DLY_CTRL2T<0:M> and DLY_CTRL2B<0:M> by delaying the word line driving control signal R2AC by a preset second delay amount stress section signal. For example, the second delay block 130 may include a skewed delay circuit for delaying a disablement edge of the word line driving control signal R2AC.

The equalization control block 140 may generate a bit line equalization signal BLEQ in response to the bit line equalization control signal R3ACB.

The equalization block 150 may precharge and equalize a pair of bit lines BL and BLB with a second voltage in response to the bit line equalization signal BLEQ. For example, the equalization block 150 may precharge and equalize the bit lines BL and BLB with a bit line precharge voltage VBLP during a precharge mode.

The stress section defining block 160 may generate the stress section signal NBTI_CTRLB corresponding to the stress section in response to the active signal RACT and the bit line equalization control signal R3ACB. The stress section or low-enablement of the stress section signal NBTI_CTRLB may range from low-enablement of the bit line equalization control signal R3ACB to high-enablement of the active signal RACT, which will be described later with reference to FIG. 7.

The stress prevention block 170 may disable the first delay amount control signals DLY_CTRL1T<0:N> and DLY_CTRL1B<0:N> and the second delay amount control signals DLY_CTRL2T<0:M> and DLY_CTRL2B<0:M> during the stress section in response to the stress section signal NBTI_CTRLB. For example, in response to the stress section signal NBTI_CTRLB, the stress prevention block 170 may generate the first delay amount control signals DLY_CTRL1T<0:N> and DLY_CTRL1B<0:N> corresponding to a plurality of first delay amount set signal FS1<0:N> or a high voltage VDD level, and may generate the second delay amount control signals DLY_CTRL2T<0:M> and DLY_CTRL2B<0:M> corresponding to a plurality of second delay mount set signal FS2<0:M> or the high voltage VDD level stress section signal. Each of the first delay amount set signal FS1<0:N> and the second delay mount set signal FS2<0:M> may include a fused signal.

Figure 3:
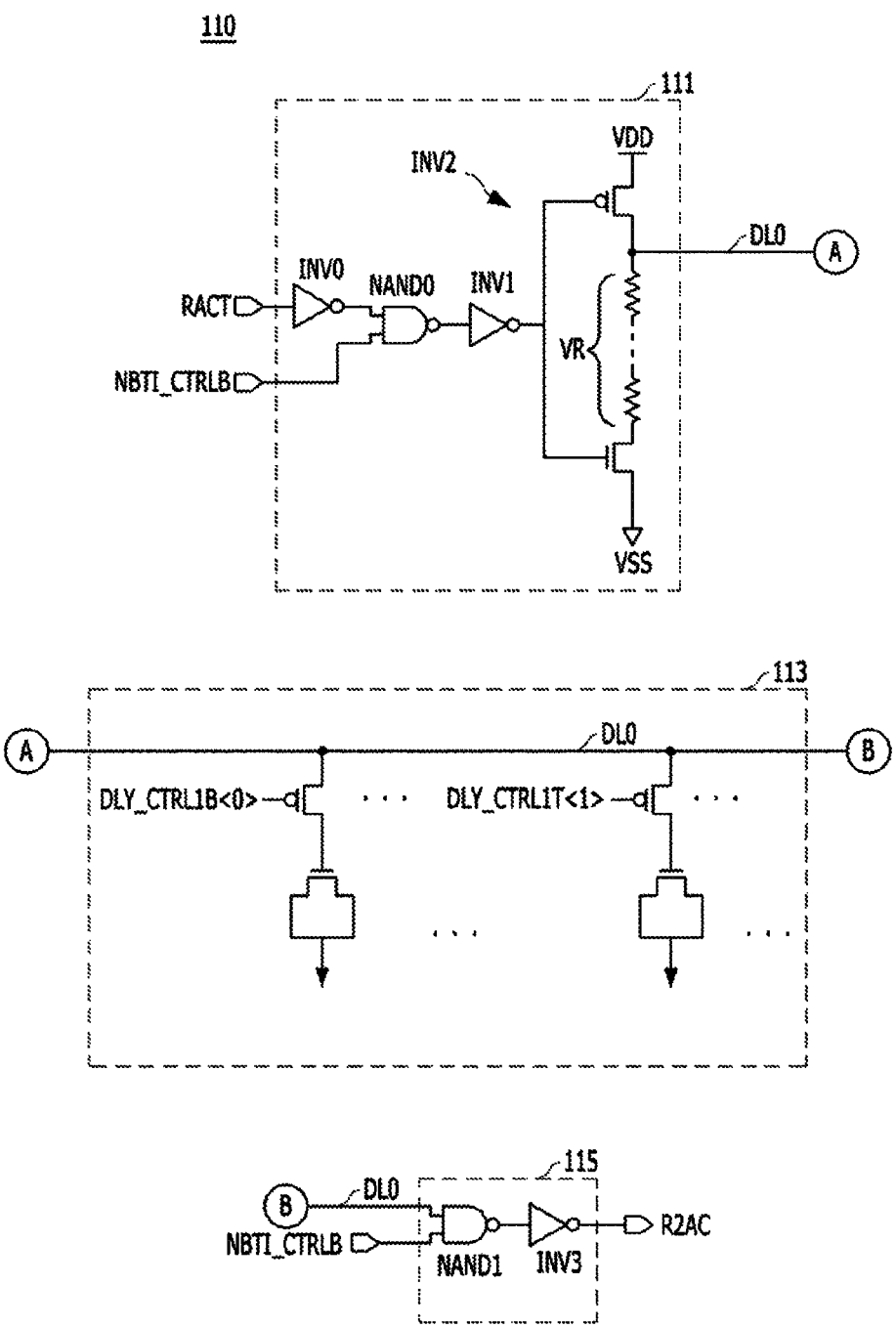
FIG. 3 is a circuit diagram illustrating a first delay block of a semiconductor device as shown in FIG. 2, according to an embodiment of the present invention.

FIG. 3 illustrates the main components of a first delay block 110 as shown in FIG. 2, according to an embodiment of the invention.

Referring to FIG. 3, the first delay block 110 may include a first pre-stress unit 111, a first delay amount reflection unit 113, and a first main stress unit 115.

The first pre-stress unit 111 may output a first load signal, which corresponds to the active signal RACT during the active mode and corresponds to the high voltage VDD level during the precharge mode, to a first delay line DL0 in response to the stress section signal NBTI_CTRLB. For example, the first pre-stress unit 111 may include a first inverter INV0, a first NAND gate NAND0, a second inverter INV1, and a third inverter INV2. The first inverter INV0 may invert the active signal RACT to generate a first inverted signal. The first NAND gate NAND0 may perform a NAND operation on the first inverted signal and the stress section signal NBTI_CTRLB to generate a first operation signal. The second inverter INV1 may invert the first operation signal to generate a second inverted signal. The third inverter INV2 may invert the second inverted signal to generate the first load signal. The third inverter INV2 may include a resistance VR between an NMOS transistor and an output terminal of the first load signal which is a node coupled to the first delay line DL0. The resistance VR may form a RC delay together with a plurality of first delay elements, which are to be described below, when the NMOS transistor of the third inverter INV2 is turned on.

The first delay amount reflection unit 113 is coupled to the first delay line DL0 and may reflect a first delay amount in the first load signal in response to the first delay amount control signals DLY_CTRL1T<0:N> and DLY_CTRL1B<0:N>. For example, the first delay amount reflection unit 113 may include a plurality of first delay elements and a plurality of first coupling elements. Each of the first delay elements may include a capacitor. Each of the first coupling elements may include a PMOS transistor. Particularly, the first coupling elements may couple the first delay elements to the first delay line DL0 during the active mode in response to the first delay amount control signals DLY_CTRL1T<0:N> and DLY_CTRL1B<0:N>. The first coupling elements may be turned off during the precharge mode in response to the first delay amount control signals DLY_CTRL1T<0:N> and DLY_CTRL1B<0:N>, thereby protected from the NBTI.

The first main stress unit 115 may generate the word line driving control signal R2AC, which corresponds to the active signal RACT during the active mode and to the high voltage VDD level during the precharge mode, in response to the stress section signal NBTI_CTRLB and the first load signal. For example, the first main stress unit 115 may include a second NAND gate NAND1 and a fourth inverter INV3. The second NAND gate NAND1 may perform a NAND operation on the first load signal and the stress section signal NBTI_CTRLB to generate a second operation signal. The fourth inverter INV3 may invert the second operation signal to generate the word line driving control signal R2AC. One or more PMOS transistors (not shown) included in the second NAND gate NAND1 may be turned off during the precharge mode in order to be protected from the NBTI.

Figure 4:
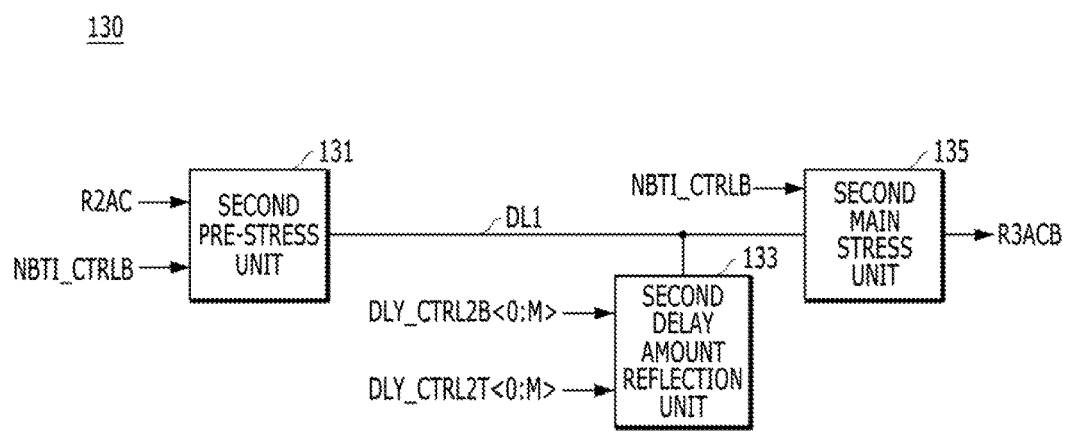
FIG. 4 is a block diagram illustrating a second delay block of a semiconductor device as shown in FIG. 2, according to an embodiment of the present invention.

FIG. 4 is a block diagram illustrating the second delay block 130 shown in FIG. 2, according to an embodiment of the invention.

Referring to FIG. 4, the second delay block 130 may include a second pre-stress unit 131, a second delay amount reflection unit 133, and a second main stress unit 135.

The second pre-stress unit 131, the second delay amount reflection unit 133, and the second main stress unit 135 may be formed identically or substantially identically to the first pre-stress unit 111, the first delay amount reflection unit 113, and the first main stress unit 115, respectively. However, it should be understood that the second pre-stress unit 131, the second delay amount reflection unit 133, and the second main stress unit 135 may be formed differently from the first pre-stress unit 111, the first delay amount reflection unit 113, and the first main stress unit 115, provided that similarly to the first pre-stress unit 111, the second pre-stress unit 131 may output a second load signal corresponding to the high voltage VDD level during the precharge mode to a second delay line DL1 in response to the stress section signal NBTI_CTRLB, and also similarly to the first main stress unit 115, the second main stress unit 135 may include a NAND gate for performing a NAND operation on the second load signal and the stress section signal NBTI_CTRLB.

Figure 5:
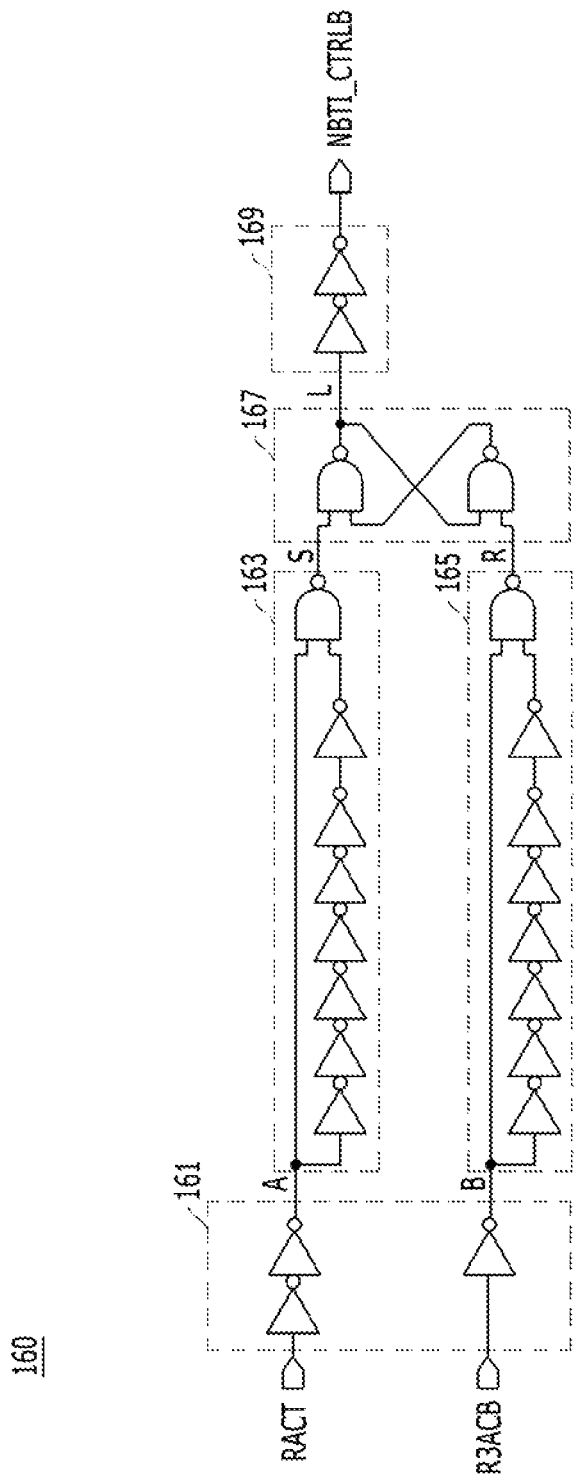
FIG. 5 is a circuit diagram illustrating a stress section block shown in FIG. 2, according to an embodiment of the present invention.

FIG. 5 is a circuit diagram illustrating an example of a stress section defining block 160 as shown in FIG. 2.

Referring to FIG. 5, the stress section defining block 160 may include an input unit 161, a first pulse generation unit 163, a second pulse generation unit 165, a section signal generation unit 167, and an output unit 169.

The input unit 161 may receive the active signal RACT and the bit line equalization control signal R3ACB, respectively. Then the input unit 161 may non-invert the active signal RACT to generate a first input signal A. Also, input unit 161 may invert the bit line equalization control signal R3ACB to generate a second input signal B.

The first pulse generation unit 163 may generate a first pulse signal S in response to the first input signal A. For example, the first pulse generation unit 163 may generate the first pulse signal S that pulses at the high-enablement of the active signal RACT. The first pulse signal S may correspond to the termination signal S, which is described above with reference to FIG. 1.

The second pulse generation unit 165 may generate a second pulse signal R in response to the second input signal B. For example, the second pulse generation unit 165 may generate the second pulse signal R that pulses at the low-enablement of the bit line equalization control signal R3ACB. The second pulse signal R may correspond to the start signal R, which is described above with reference to FIG. 1.

The section signal generation unit 167 may generate a section signal L that is enabled during the stress section in response to the first pulse signal S and the second pulse signal R. For example, the section signal generation unit 167 may include a RS latch circuit which enables the section signal L in response to the second pulse signal R and disables the section signal L in response to the first pulse signal S.

The output unit 169 may generate the stress section signal NBTI_CTRLB from the section signal L. For example, the output unit 169 may non-invert the section signal L to generate the stress section signal NBTI_CTRLB.

Figure 6:
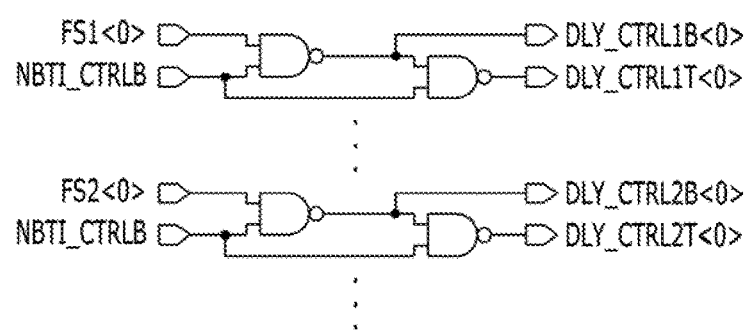
FIG. 6 is a circuit diagram illustrating a stress prevention block shown in FIG. 2, according to an embodiment of the present invention.

FIG. 6 is a circuit diagram Illustrating an example of a stress prevention block 170 as shown in FIG. 2.

Referring to FIG. 6, the stress prevention block 170 may perform a NAND operation on each of the first delay amount set signal FS1<0:N> and the stress section signal NBTI_CTRLB to generate the first delay amount control signals DLY_CTRL1T<0:N> and DLY_CTRL1B<0:N>. Further, the stress prevention block 170 may perform the NAND operation on each of the second delay mount set signal FS2<0:M> and the stress section signal NBTI_CTRLB to generate the second delay amount control signals DLY_CTRL2T<0:M> and DLY_CTRL2B<0:M>.

For example, the stress prevention block 170 may disable the first delay amount control signals DLY_CTRL1T<0:N> and DLY_CTRL1B<0:N> to the high voltage VDD level regardless of the first delay amount set signal FS1<0:N> during the precharge mode. Further, the stress prevention block 170 may disable the second delay amount control signals DLY_CTRL2T<0:M> and DLY_CTRL2B<0:M> to the high voltage VDD level, regardless of the second delay mount set signal FS2<0:M> during the precharge mode.

Figure 7:
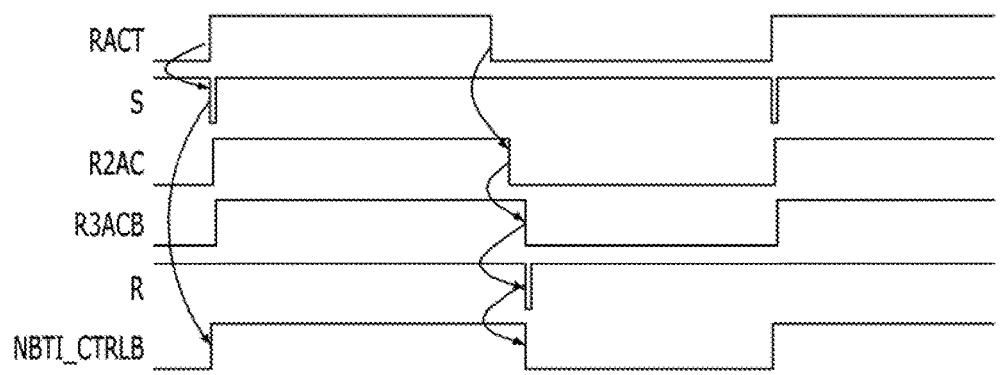
FIG. 7 is a timing diagram for describing an operation of the semiconductor device shown in FIG. 2, according to an embodiment of the present invention.

Hereinafter, an operation of the memory device 100 having the aforementioned structure is described with reference to FIG. 7 Specifically, FIG. 7 is a timing diagram for describing the operation of the memory device 100 according to an embodiment of the present invention.

First, an operation of the memory device 100 corresponding to the active mode is described below.

Referring now to FIG. 7, the memory device 100 may enter the active mode as the active signal RACT is enabled to a logic high level.

During the active mode, the first delay block 110 may enable the word line driving control signal R2AC to a logic high level, and the second delay block 130 may disable the bit line equalization control signal R3ACB to a logic high level. Accordingly, the word line driving block 120 may drive the word line WL, and the equalization control block 140 may disable the equalization block 150.

According to the high-enabled active signal RACT, the stress section defining block 160 may disable the stress section signal NBTI_CTRLB to a logic high level. Accordingly, the stress prevention block 170 may generate the first delay amount control signals DLY_CTRL1T<0:N> and DLY_CTRL1B<0:N> corresponding to the first delay amount set signal FS1<0:N>, and may generate the second delay amount control signals DLY_CTRL2T<0:M> and DLY_CTRL2B<0:M> corresponding to the second delay mount set signal FS2<0:M>.

As the active signal RACT is disabled to a logic low level, the memory device 100 may get out of the active mode.

At the end of the active mode, the first delay block 110 may disable the word line driving control signal R2AC to a logic low level after the low-disablement of the active signal RACT in response to the first delay amount control signals DLY_CTRL1T<0:N> and DLY_CTRL1B<0:N>. For example, when the active signal RACT transitions from a logic high level to a logic low level, the RC delay may be formed and thus the first delay block 110 may delay disablement of the word line driving control signal R2AC subsequently to the disablement of the active signal RACT. Accordingly, the word line driving block 120 may not drive the word line WL.

The second delay block 130 may enable the bit line equalization control signal R3ACB to a logic low level subsequently to the low-disablement of the word line driving control signal R2AC in response to the second delay amount control signals DLY_CTRL2T<0:M> and DLY_CTRL2B<0:M>. For example, when the word line driving control signal R2AC transitions from a logic high level to a logic low level, the RC delay may be formed and thus the second delay block 130 may delay the enablement of the bit line equalization control signal R3ACB subsequently to the disablement of the word line driving control signal R2AC. Accordingly, the equalization control block 140 may enable the equalization block 150.

Next, an operation of the memory device 100 during the precharge mode is described below.

Referring to FIG. 7, as the bit line equalization control signal R3ACB is enabled to a logic low level, the memory device 100 may enter the precharge mode.

During the precharge mode, the stress section defining block 160 may enable the stress section signal NBTI_CTRLB to a logic low level. The input unit 161 may invert the bit line equalization control signal R3ACB to generate the second input signal B, and the second pulse generation unit 165 may generate the second pulse signal R that pulses at the enablement of the bit line equalization control signal R3ACB in response to the second input signal B, and the section signal generation unit 167 may generate the section signal L having a logic low level in response to the second pulse signal R, and the output unit 169 may output the stress section signal NBTI_CTRLB which is enabled to a logic low level in response to the section signal L.

Subsequently, when the memory device 100 enters the active mode again, the stress section defining block 160 may disable the stress section signal NBTI_CTRLB to a logic high level. In other words, the input unit 161 may non-invert the active signal RACT to generate the first input signal A, and the first pulse generation unit 163 may generate the first pulse signal S that pulses at the enablement of the active signal RACT in response to the first Input signal A, and the section signal generation unit 167 may generate the section signal L having a logic high level in response to the first pulse signal S, and the output unit 169 may output the stress section signal NBTI_CTRLB which is disabled to a logic high level in response to the section signal L.

Continuously, the stress prevention block 170 may output the first delay amount control signals DLY_CTRL1T<0:N> and DLY_CTRL1B<0:N> to the high voltage VDD level regardless of the first delay amount set signal FS1<0:N>, and may output the second delay amount control signals DLY_CTRL2T<0:M> and DLY_CTRL2B<0:M> to the high voltage VDD level regardless of the second delay mount set signal FS2<0:M> during the precharge mode.

Accordingly, the first delay block 110 and the second delay block 130 may be protected from the NBTI during the stress section corresponding to the precharge mode. The first delay block 110 and the second delay block 130 may be protected from the NBTI based on the same reason, and thus the first delay block 110 during the stress section corresponding to the precharge mode is representatively described in detail below.

As the first pre-stress unit 111 drives the first delay line DL0 to the high voltage VDD level during the stress section, elements included in the first main stress unit 115, which are the PMOS transistors included in the second NAND gate NAND1, may be protected from the stress caused by the NBTI. This is because the PMOS transistors included in the second NAND gate NAND1 are turned off as the first delay line DL0 is driven to the high voltage VDD level. When it is contemplated that the PMOS transistors included in the second NAND gate NAND1 deteriorate due to the NBTI, the disablement edge of the word line driving control signal R2AC may be delayed subsequently to an expected moment.

A portion of the PMOS transistors included in the first pre-stress unit 111 may not be protected from the NBTI and thus may be deteriorated during the stress section. However, the deterioration of the portion of the PMOS transistors may be ignored because an influence on the word line driving control signal R2AC due to the deterioration of the portion of the PMOS transistors is ignorable as compared with a case where the PMOS transistors included in the second NAND gate NAND1 deteriorate.

The coupling elements included in the first delay amount reflection unit 113 may be turned off in response to the first delay amount control signals DLY_CTRL1T<0:N> and DLY_CTRL1B<0:N> having the high voltage VDD level during the stress section. Therefore, the coupling elements may be protected from stress caused by the NBTI during the stress section. When it is contemplated that the coupling elements deteriorate due to the NBTI, channels may not be formed sufficiently when the coupling elements are turned on. In this case, as the delay amount reflected from the delay elements is changed, the word line driving control signal R2AC may be erroneously disabled at a wrong timing.

According to the embodiments of the present invention, as the PMOS transistors included in the delay blocks may be protected from stress due to NBTI during the precharge mode or the stress section, the word line driving control signal and the bit line equalization control signal may be generated at a right timing during the active mode.

According to the embodiments of the present invention, the operational reliability may be improved as the semiconductor device becomes robust to the NBTI phenomenon.

While the present invention has been described by making reference to specific embodiments, the embodiments are not intended to be restrictive. Further, it is noted that the present invention may be achieved in various other ways through substitution, change, and modification, by those skilled in the art after having read the present disclosure without departing from the scope of the present invention as defined by the following claims.

What is claimed is:

1. A semiconductor device, comprising:
a first pre-stress block suitable for generating a first load signal, which corresponds to an active signal during an active mode and/or to a high voltage level during a precharge mode, in response to a stress section signal;
a first delay amount reflection block suitable for reflecting a first delay amount in the first load signal in response to one or more first delay amount control signals; and
a first main stress block suitable for generating a word line driving control signal, which corresponds to the active signal during the active mode and the high voltage level during the precharge mode, in response to the stress section signal and the first load signal.

2. The semiconductor device of claim 1, further comprising:
a second pre-stress block suitable for generating a second load signal, which corresponds to the word line driving control signal during the active mode and the high voltage level during the precharge mode, in response to the stress section signal;
a second delay amount reflection block suitable for reflecting a second delay amount in the second load signal in response to a plurality of second delay amount control signals; and
a second main stress block suitable for generating a bit line equalization control signal, which corresponds to the word line driving control signal during the active mode and the high voltage level during the precharge mode, in response to the stress section signal and the second load signal.

3. The semiconductor device of claim 2, wherein the first main stress block and the second main stress block are protected from stress caused by negative bias temperature instability (NBTI) during the precharge mode.

4. The semiconductor device of claim 2, further comprising: a stress section defining block suitable for generating the stress section signal corresponding to a stress section in response to the active signal and the bit line equalization control signal.

5. The semiconductor device of claim 4, wherein the stress section defining block defines the stress section ranging from a low-enablement of the bit line equalization control signal to a high-enablement of the active signal.

6. The semiconductor device of claim 4, wherein the stress section defining block comprises:
an input unit suitable for receiving the active signal and the bit line equalization control signal;
a first pulse generation unit suitable for generating a first pulse signal that pulses at the high-enablement of the active signal;
a second pulse generation unit suitable for generating a second pulse signal that pulses at the low-enablement of the bit line equalization control signal;
a section signal generation unit suitable for generating a section signal that is enabled during the stress section in response to the first pulse signal and the second pulse signal; and
an output unit suitable for outputting the section signal as the stress section signal.

7. The semiconductor device of claim 6, wherein the section signal generation unit comprises a RS latch circuit that enables the section signal in response to the second pulse signal and disables the section signal in response to the first pulse signal.

8. The semiconductor device of claim 4, further comprising:
a stress prevention block is suitable for disabling the first delay amount control signals and the second delay amount control signals during the stress section in response to the stress section signal.

9. The semiconductor device of claim 8, wherein the stress prevention block generates the first delay amount control signals corresponding to a plurality of first delay amount set signals or the high voltage level, and generates the second delay amount control signals corresponding to a plurality of second delay amount set signals or the high voltage level in response to the stress section signal.

10. The semiconductor device of claim 9, wherein the first delay amount reflection block comprises:
a plurality of first delay elements suitable for reflecting the first delay amount in the first load signal; and
a plurality of first coupling units suitable for coupling the first delay elements to a first delay line where the first load signal is transmitted in response to the first delay amount control signals.

11. The semiconductor device of claim 10, wherein the second delay amount reflection block comprises:
a plurality of second delay elements suitable for reflecting the second delay amount in the second load signal; and
a plurality of second coupling units suitable for coupling the second delay elements to a second delay line where the second load signal is transmitted in response to the second delay amount control signals.

12. The semiconductor device of claim 11, wherein the first coupling units and the second coupling units are protected from stress caused by NBTI during the stress section.

13. A semiconductor device, comprising:
a delay block suitable for generating an output signal in response to a plurality of delay amount control signals by delaying an input signal by a preset delay amount;
a stress section defining block suitable for generating a stress section signal corresponding to a stress section in response to an operation-on signal and an operation-off signal corresponding to an operation mode and a wait mode of the delay block; and
a stress prevention block suitable for disabling the delay amount control signals during the stress section in response to the stress section signal.

14. The semiconductor device of claim 13, wherein the delay block comprises:
an input unit suitable for receiving the input signal;
an output unit suitable for outputting the output signal;
a delay line coupled between the input unit and the output unit;
a plurality of delay elements suitable for reflecting the delay amount in the delay line; and
a plurality of coupling elements suitable for coupling the delay elements to the delay line in response to the delay amount control signals.

15. The semiconductor device of claim 14, wherein the coupling elements are protected from stress caused by negative bias temperature instability (NBTI) during the stress section.

16. The semiconductor device of claim 13, wherein the delay block comprises a skewed delay circuit.

17. The semiconductor device of claim 13, wherein the stress section defining block defines the stress section ranging from enablement of the operation-off signal to enablement of the operation-on signal.

18. The semiconductor device of claim 13, wherein the stress section defining block comprises:
an input unit suitable for receiving the operation-on signal and the operation-off signal;
a first pulse generation unit suitable for generating a first pulse signal that pulses at the enablement of the operation-on signal;
a second pulse generation unit suitable for generating a second pulse signal that pulses at the enablement of the operation-off signal;
a section signal generation unit suitable for generating a section signal that is enabled during the stress section in response to the first pulse signal and the second pulse signal; and
an output unit suitable for outputting the section signal as the stress section signal.

19. The semiconductor device of claim 18, wherein the section signal generation unit comprises a RS latch circuit that enables the section signal in response to the second pulse signal and disables the section signal in response to the first pulse signal.

20. The semiconductor device of claim 13, wherein the stress prevention block generates the delay amount control signals corresponding to a plurality of delay amount set signals or a high voltage level in response to the stress section signal.

* * * * *